United States Patent
Ang et al.

(10) Patent No.: US 6,300,172 B1
(45) Date of Patent: Oct. 9, 2001

(54) METHOD OF FIELD ISOLATION IN SILICON-ON-INSULATOR TECHNOLOGY

(75) Inventors: Ting Cheong Ang, Singapore (SG); Shyue Pong Quek, Petaling Jaya (MY); Lap Chan, San Francisco, CA (US); Sang Yee Loong, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/409,887

(22) Filed: Oct. 1, 1999

(51) Int. Cl.[7] ................................................ H01L 21/00
(52) U.S. Cl. .................... 438/149; 438/303; 438/295; 438/404; 438/311
(58) Field of Search ............................... 438/149, 219, 438/404, 299, 303, 305, 306, 424, 295, 296, 311

(56) References Cited

U.S. PATENT DOCUMENTS

| | | | |
|---|---|---|---|
| 5,525,533 | 6/1996 | Woodruff et al. | 437/60 |
| 5,539,229 | 7/1996 | Noble, Jr. et al. | 257/301 |
| 5,610,083 | 3/1997 | Chan et al. | 437/21 |
| 5,892,707 | 4/1999 | Noble | 365/149 |
| 5,950,090 * | 9/1999 | Chen et al. | 438/296 |
| 6,110,787 * | 9/1999 | Chan et al. | 438/300 |

* cited by examiner

*Primary Examiner*—Charles Bowers
*Assistant Examiner*—Jack Chen
(74) *Attorney, Agent, or Firm*—George O. Saile; Rosemary L. S. Pike; Stephen G. Stanton

(57) ABSTRACT

A method of fabricating an SOI transistor device comprises the following steps. a silicon semiconductor structure is provided. A silicon oxide layer is formed over the silicon semiconductor structure. A silicon-on-insulator layer is formed over the oxide layer. A well is implanted in the silicon-on-insulator layer. A gate oxide layer is grown over the silicon-on-insulator layer. A polysilicon layer is deposited over the gate oxide layer. The polysilicon layer, gate oxide layer, and silicon oxide layer are patterned and etched to form trenches. The trenches are filled with an isolation material to at least a level even with a top surface of the polysilicon layer to form raised shallow trench isolation regions (STIs). The polysilicon layer is patterned and the non-gate portions are removed polysilicon adjacent the raised STIs forming a gate conductor between the raised STIs with the gate conductor and said raised STIs having exposed sidewalls. The gate oxide layer is removed between the gate conductor and the raised STIs, and outboard of the raised STIs. The source and drain are formed in the silicon-on-insulator layer adjacent the gate spacers. Silicide regions may then be formed on the source and drain.

27 Claims, 2 Drawing Sheets

METHOD OF FIELD ISOLATION IN SILICON-ON-INSULATOR TECHNOLOGY

FIELD OF THE INVENTION

The present invention relates generally to methods of forming a transistor device with field isolation, or shallow trench isolation regions (STI), and specifically to forming a transistor device with shallow trench isolation regions in silicon-on-insulator (SOI) technology.

BACKGROUND OF THE INVENTION

Corner effects in current shallow trench isolation regions (STI) architecture leads to undesirable high leakage current and gate oxide isolation (GOI) issues.

U.S. Pat. No. 5,539,229 to Nobel, Jr. et al. describes a semiconductor structure comprising a transistor having a gate conductor that has first and second edges bounded by raised isolation structures, e.g. STI. A source diffusion is self-aligned to the third edge and a drain diffusion is self-aligned to the fourth edge of the gate electrode.

U.S. Pat. No. 5,610,083 to Chan et al. describes a process for creating a back gate contact in an SOI layer that can be incorporated into a MOSFET fabrication recipe. The back gate consists of an etched trench lined with insulator and filled with doped polysilicon. The polysilicon filled trench electrically connects the semiconductor substrate to overlying metal contacts.

U.S. Pat. No. 5,525,533 to Woodruff et al. describes a low voltage coefficient MOS capacitor, and a method of making such a capacitor, having substantially uniform parasitic effects over an operating voltage range and a low voltage coefficient. The capacitor comprises a first conductive layer superjacent a silicon-on-insulator substrate. The first conductive layer comprises heavily doped silicon having a first conductivity type while the substrate comprises a second conductivity type. The conductor further comprises an isolation trench surrounding the first conductive layer filled with a dielectric material. Positioned superjacent the first conductive layer is a dielectric layer thereby forming a dielectric shell on all sides of the first conductive layer except for its upper face. A second conductive layer is positioned superjacent the dielectric layer to form a low voltage coefficient capacitor.

U.S. Pat. No. 5,892,707 to Noble describes a memory array including a semiconductor substrate, an isolation trench disposed in the substrate, and a conductor that is disposed in the trench. The array also includes a memory cell that is coupled to the conductor in the trench. The conductor may be a digit line that is coupled to a source/drain of the memory cell or to a shared source/drain region of a pair of adjacent memory cells.

SUMMARY OF THE INVENTION

Accordingly, it is an object of the present invention to provide a method of forming shallow trench isolation regions in silicon-on-insulator technology reducing corner effects.

Another object of the present invention is to provide a method of forming shallow trench isolation regions in silicon-on-insulator technology reducing corner effects leading to leakage current and gate oxide isolation issues.

Other objects will appear hereinafter.

It has now been discovered that the above and other objects of the present invention may be accomplished in the following manner. Specifically, a silicon semiconductor structure is provided. A silicon oxide layer is formed over the silicon semiconductor structure. A silicon-on-insulator layer is formed over the oxide layer. A well is implanted in the silicon-on-insulator layer. A gate oxide layer is grown over the silicon-on-insulator layer. A polysilicon layer is deposited over the gate oxide layer. The polysilicon layer, gate oxide layer, and silicon oxide layer are patterned and etched to form trenches. The trenches are filled with an isolation material to at least a level even with a top surface of the polysilicon layer to form raised shallow trench isolation regions (STIs). The polysilicon layer is patterned and the non-gate portions are removed polysilicon adjacent the raised STIs forming a gate conductor between the raised STIs with the gate conductor and said raised STIs having exposed sidewalls. The gate oxide layer is removed between the gate conductor and the raised STIs, and outboard of the raised STIs. The source and drain are formed in the silicon-on-insulator layer adjacent the gate spacers. Silicide regions may then be formed on the source and drain.

BRIEF DESCRIPTION OF THE DRAWINGS

The features and advantages of the method of fabricating a silicon-on-insulator transistor device according to the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Figure 1:
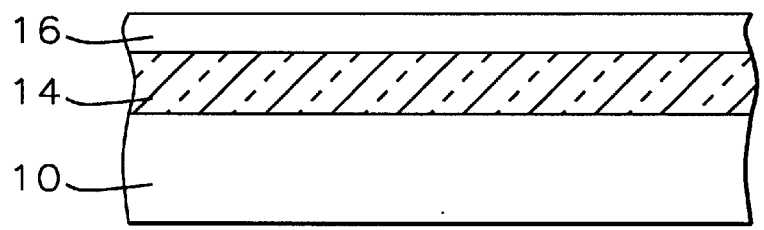
FIGS. 1 through 4 schematically illustrate in cross-sectional representation a preferred embodiment of the present invention.

Accordingly as shown in FIG. 1, starting silicon semiconductor structure 10 has an upper silicon surface and is understood to possibly include a semiconductor wafer or substrate, active and passive devices formed within the wafer, conductive layers and dielectric layers (e.g., interpoly oxide (IPO), intermetal dielectric (IMD), etc.) formed over the wafer surface. The term "semiconductor structure" is meant to include devices formed within a semiconductor wafer and the layers overlying the wafer. Unless otherwise specified, all structures, layers, etc. may be formed or accomplished by conventional methods known in the prior art.

Silicon oxide layer 14 is formed over silicon semiconductor structure 10 to a thickness from about 80 to 400 nm.

Silicon-on-insulator (SOI) layer 16 (polysilicon) is then formed over oxide layer 14 to a thickness from about 50 to 200 nm. Polysilicon layer 16 will be used as a CMP polishing stop and there is no need to remove layer 16 after the CMP, thus simplifying the process.

Oxide layer 14 and SOI layer 16 are preferably formed by wafer binding technique or a SIMOX (silicon implant oxide) process.

Figure 2:
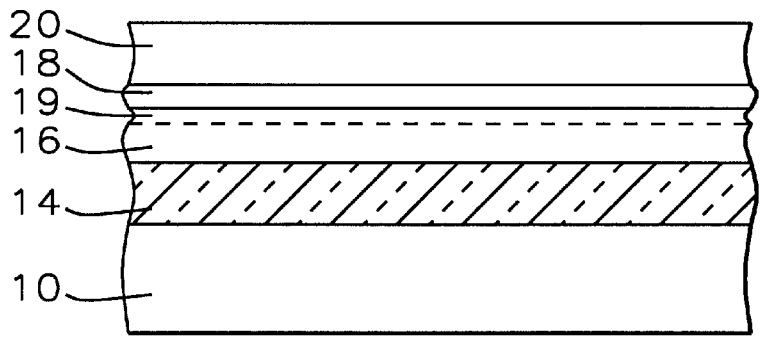

As shown in FIG. 2, a well implant 15 is implanted in SOI layer 16 followed by a threshold voltage ($V_t$) implant 19.

Gate silicon oxide (gate oxide) layer 18 is grown over the surface of SOI layer 16 to a thickness from about 1 to 20 nm.

Polysilicon layer 20 (or stack gate nitride) is then deposited over gate oxide layer 18 to a thickness from about 150 to 300 nm.

Figure 3:
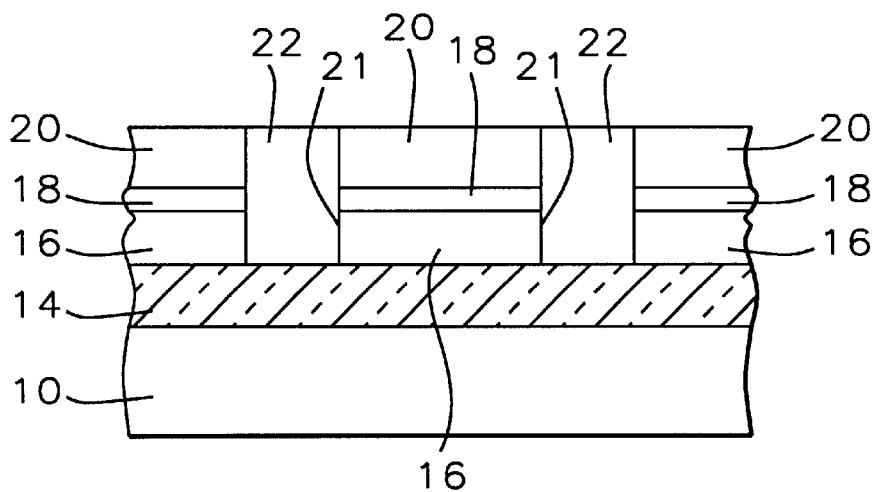

As shown in FIG. 3, poly layer 20, gate oxide layer 18 and SOI layer 16 are patterned and etched to form trenches 21 down to the upper surface of oxide layer 14 preferably using suitable lithography, e.g. photo resist layers with openings, and reactive ion etching (RIE) techniques. Trenches 21 are from about 100 to 1000 nm wide.

Trenches 21 are filled with an appropriate isolation material, such as SiON, $Si_3N_4$, or more preferably $SiO_2$, deposited by low pressure chemical vapor deposition (LPCVD) or other suitable techniques at least level with the top surface of poly layer 20.

The isolation material is then planarized as necessary, preferably by chemical mechanical polishing (CMP), to form raised shallow isolation trench regions (STI) 22. It is noted that STIs 22 are formed after formation of polysilicon layer 20 and gate oxide layer 18.

Figure 4:
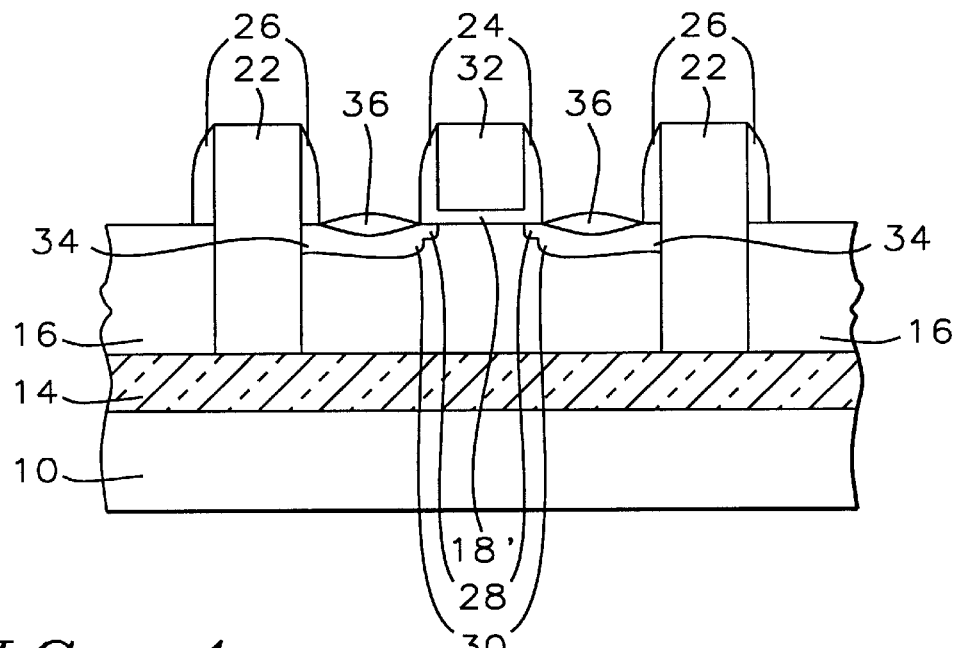

As shown in FIG. 4, a transistor device can be formed between raised STIs 22 as follows. Poly layer 20 is then patterned and non-gate portions of poly layer 20 are removed to form gate conductor 32 between raised shallow isolation trenches 22. Gate oxide layer 18 between gate conductor 32 and raised shallow isolation trenches 22 is then removed leaving gate oxide layer 18' underneath gate conductor 32.

It is noted that 18' is a portion of the original gate oxide layer 18—no additional steps are required in its formation. Gate conductor 32 and raised shallow isolation trenches 22 each have exposed gate sidewalls. Low doped source/drain (LDD) ion implants 28 for the source/drain junctions may be performed prior to the gate spacer 24 and isolation spacer 26 formation.

Isolation spacers 26 are formed adjacent raised shallow isolation trenches 22 on their exposed sidewalls, and gate spacers 24 are formed adjacent gate conductor 32 on its exposed gate sidewalls. Isolation and gate spacers 26, 24, respectively, may be formed of SiON or $SiO_2$ and most preferably of an $SiN/SiO_2$ stack.

Spacers 26, 24 can be formed by LPCVD depositing from about 30 to 200 nm, and more preferably from about 60 to 150 nm, of an $SiN/SiO_2$ stack (i.e., a SiN layer may be deposited first followed by a $SiO_2$ layer), followed by an reactive ion etch (RIE) spacer etch. Isolation spacers 26 and gate spacers 24 are each from about 30 to 200 nm wide.

Source and drain 34 may be doped by conventional techniques such as ion implantation, and then annealed to form doped source/drain 34 with low doped portions 28 and heavily doped regions 30.

Silicide regions 36 may then formed over source/drain regions 34. The use of isolation spacers 26 permit better control of formation of silicide regions 36 since there is less field edge related junction leakage (corner effect).

The SOI transistor device of the present invention over comes/minimizes the corner effects by/because isolation spacers 26 separate silicide regions 36 from STI regions 22 and the substrate 14 adjacent STI regions 22, i.e., the corner where silicon, silicide, and silicon oxide meet. The corner is a high stress area because three films (silicon, silicide, and silicon oxide) press against each other (see FIG. 5).

Figure 5:
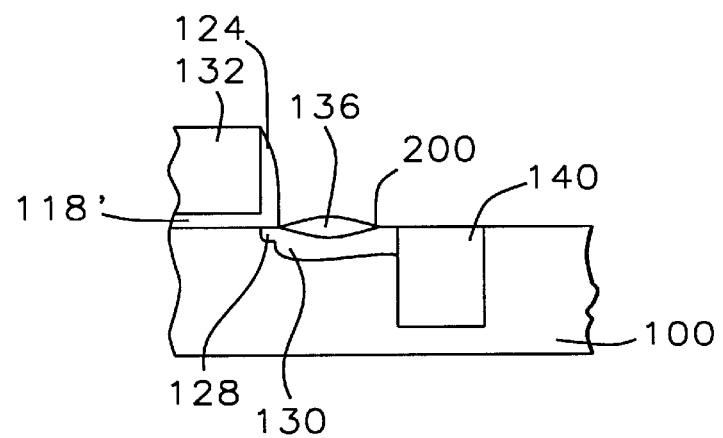
FIG. 5 is a schematic illustration of a portion of a prior art semiconductor device.

FIG. 5 illustrates the corner effects at the junction 200 of silicon substrate 100, silicide region 136, and the silicon oxide of STI region 140 for the device having gate conductor 132, underlying gate oxide layer 118', sidewall spacer 124, LDD 128 and heavily doped region 130.

An interlevel dielectric layer (ILD) (not shown) may then be formed over the SOI transistor device of the present invention with ILD contacts (not shown) (comprised of tungsten, e.g.) connected to source/drain 34.

While particular embodiments of the present invention have been illustrated and described, it is not intended to limit the invention, except as defined by the following claims.

We claim:

1. A method of fabricating an SOI transistor device, comprising the sequential steps of:

providing a silicon semiconductor structure;

forming a silicon oxide layer over said silicon semiconductor structure;

forming a silicon-on-insulator layer over said silicon oxide layer;

implanting a well in said silicon-on-insulator layer;

growing a gate oxide layer over said silicon-on-insulator layer;

depositing a polysilicon layer over said gate oxide layer;

patterning and etching said polysilicon layer, said gate oxide layer, and said silicon-on-insulator layer to form trenches exposing a portion of said silicon oxide layer;

filling said trenches only with an isolation material to at least a level even with a top surface of said polysilicon layer to form raised shallow trench isolation regions (STIs);

patterning said polysilicon layer to remove portions of said polysilicon layer adjacent said raised STIs and to form a gate conductor comprised of a portion of said polysilicon layer between said raised STIs; said gate conductor and said raised STIs having exposed sidewalls;

removing said gate oxide layer between said gate conductor and said raised STIs, and outboard of said raised STIs;

forming isolation spacers on said exposed sidewalls of said raised STIs and gate spacers on said exposed sidewalls of said gate conductor;

forming source and drain in said silicon-on-insulator layer adjacent said gate spacers; and forming silicide regions on said source and drain.

2. The method of claim 1, further including the steps of:

forming a threshold voltage implant in said silicon-on-insulator layer before said gate oxide layer growth step; and doping said source and drain forming low doped regions outward of said gate conductor and heavy doped regions outward of said low doped regions.

3. The method of claim 1, wherein said isolation material filling said raised STIs is $SiO_2$.

4. The method of claim 1, wherein said gate oxide layer is from about 1 to 20 nm thick.

5. The method of claim 1, wherein said polysilicon layer is from about 150 to 300 nm thick.

6. The method of claim 1, wherein said trenches are from about 100 to 1000 nm wide.

7. The method of claim 1, further including the steps of:

forming isolation spacers on said exposed sidewalls of said raised STIs and gate spacers on said exposed sidewalls of said gate conductor; wherein said isolation spacers are from about 30 to 200 nm wide and said gate spacers are from about 30 to 200 nm wide.

8. A method of fabricating an SOI transistor device, comprising the sequential steps of:

providing a silicon semiconductor structure;

forming a silicon oxide layer over said silicon semiconductor structure;

forming a silicon-on-insulator layer over said silicon oxide layer;

implanting a well in said silicon-on-insulator layer;

growing a gate oxide layer over said silicon-on-insulator layer;

depositing a polysilicon layer over said gate oxide layer;

patterning and etching said polysilicon layer, said gate oxide layer, and said silicon-on-insulator layer to form trenches exposing a portion of said silicon oxide layer;

filling said trenches only with an isolation material to at least a level even with a top surface of said polysilicon layer to form raised shallow trench isolation regions (STIs); said isolation material being SiO$_2$;

patterning said polysilicon layer to remove portions of said polysilicon layer adjacent said raised STIs and to form a gate conductor comprised of a portion of said polysilicon layer between said raised STIs; said gate conductor and said raised STIs having exposed sidewalls;

removing said gate oxide layer between said gate conductor and said raised STIs, and outboard of said raised STIs;

forming isolation spacers on said exposed sidewalls of said raised STIs and gate spacers on said exposed sidewalls of said gate conductor;

forming source and drain in said silicon-on-insulator layer adjacent said gate spacers; and forming silicide regions on said source and drain.

9. The method of claim 8, further including the steps of:

forming a threshold voltage implant in said silicon-on-insulator layer before said gate oxide layer growth step; and doping said source and drain forming low doped regions outward of said gate conductor and heavy doped regions outward of said low doped regions.

10. The method of claim 8, wherein said gate oxide layer is from about 1 to 20 nm thick.

11. The method of claim 8, wherein said polysilicon layer is from about 150 to 300 nm thick.

12. The method of claim 8, wherein said trenches are from about 100 to 1000 nm wide.

13. The method of claim 8, wherein said isolation spacers are from about 30 to 200 nm wide and said gate spacers are from about 30 to 200 nm wide.

14. A method of fabricating an SOI transistor device, comprising the sequential steps of:

providing a silicon semiconductor structure;

forming a silicon oxide layer over said silicon semiconductor structure;

forming a silicon-on-insulator layer over said silicon oxide layer;

implanting a well in said silicon-on-insulator layer;

forming a threshold voltage implant in said silicon-on-insulator layer;

growing a gate oxide layer over said silicon-on-insulator layer;

depositing a polysilicon layer over said gate oxide layer;

patterning and etching said polysilicon layer, said gate oxide layer, and said silicon-on-insulator layer to form trenches exposing a portion of said silicon oxide layer;

filling said trenches only with an isolation material to at least a level even with a top surface of said polysilicon layer to form raised shallow trench isolation regions (STIs);

patterning said polysilicon layer to remove portions of said polysilicon layer adjacent said raised STIs and to form a gate conductor comprised of a portion of said polysilicon layer between said raised STIs; said gate conductor and said raised STIs having exposed sidewalls;

removing said gate oxide layer between said gate conductor and said raised STIs, and outboard of said raised STIs;

forming isolation spacers on said exposed sidewalls of said raised STIs and gate spacers on said exposed sidewalls of said gate conductor;

forming source and drain in said silicon-on-insulator layer adjacent said gate spacers; and forming silicide regions on said source and drain.

15. The method of claim 14, further including the step of:

doping said source and drain forming low doped regions outward of said gate conductor and heavy doped regions outward of said low doped regions.

16. The method of claim 14, wherein said isolation material filling said raised STIs is SiO$_2$.

17. The method of claim 14, wherein said gate oxide layer is from about 1 to 20 nm thick.

18. The method of claim 14, wherein said polysilicon layer is from about 150 to 300 nm thick.

19. The method of claim 14, wherein said trenches are from about 100 to 1000 nm wide.

20. The method of claim 14, wherein said isolation spacers are from about 30 to 200 nm wide and said gate spacers are from about 30 to 200 nm wide.

21. A method of fabricating an SOI transistor device, comprising the sequential steps of:

providing a semiconductor structure;

forming an oxide layer over said semiconductor structure;

forming a silicon-on-insulator layer over said oxide layer;

implanting a well in said silicon-on-insulator layer;

growing a gate oxide layer over said silicon-on-insulator layer;

depositing a polysilicon layer over said gate oxide layer;

patterning and etching said polysilicon layer, said gate oxide layer, and said silicon-on-insulator layer to form trenches exposing a portion of said oxide layer;

filling said trenches only with an isolation material to at least a level even with a top surface of said polysilicon layer to form raised shallow trench isolation regions (STIs);

patterning said polysilicon layer to remove portions of said polysilicon layer adjacent said raised STIs and to form a gate conductor comprised of a portion of said polysilicon layer between said raised STIs; said gate conductor and said raised STIs having exposed sidewalls;

removing said gate oxide layer between said gate conductor and said raised STIs, and outboard of said raised STIs; forming isolation spacers on said exposed sidewalls of said raised STIs and gate spacers on said exposed sidewalls of said gate conductor;

forming source and drain in said silicon-on-insulator layer proximate said gate conductor; and forming silicide regions on said source and drain.

22. The method of claim 21, further including the steps of:

forming a threshold voltage implant in said silicon-on-insulator layer before said gate oxide layer growth step; and doping said source and drain forming low doped regions outward of said gate conductor and heavy doped regions outward of said low doped regions.

23. The method of claim 21, wherein said isolation material filling said raised STIs is $SiO_2$.

24. The method of claim 21, wherein said gate oxide layer is from about 1 to 20 nm thick.

25. The method of claim 21, wherein said polysilicon layer is from about 150 to 300 nm thick.

26. The method of claim 21, wherein said trenches from about 100 to 1000 nm wide.

27. The method of claim 21, further including the steps of:

forming isolation spacers on said exposed sidewalls of said raised STIs and gate spacers on said exposed sidewalls of said gate conductor; wherein said isolation spacers are from about 30 to 200 nm wide and said gate spacers are from about 30 to 200 nm wide.

* * * * *

UNITED STATES PATENT AND TRADEMARK OFFICE
CERTIFICATE OF CORRECTION

PATENT NO. : 6,300,172 B1
DATED : October 9, 2001
INVENTOR(S) : Ting Cheong Ang, Shyue Fong Quek, Lap Chan, Sang Yee Loong It is certified that error appears in the above-identified patent and that said Letters Patent is hereby corrected as shown below:

<u>Title page,</u>
Item [75], delete "Shyue Pong Quek" and replace with -- Shyue Fong Quek --.

Signed and Sealed this

Twenty-sixth Day of March, 2002

*Attest:*

JAMES E. ROGAN
*Attesting Officer*   *Director of the United States Patent and Trademark Office*